(12) United States Patent
Harris et al.

(10) Patent No.: US 11,114,715 B2
(45) Date of Patent: Sep. 7, 2021

(54) ENCLOSURE ASSEMBLIES WITH IMPROVED ELECTROMAGNETIC COMPATIBILITY

(71) Applicant: FORD GLOBAL TECHNOLOGIES, LLC, Dearborn, MI (US)

(72) Inventors: Timothy Harris, Grosse Ile, MI (US); Hoa T. Dinh, Shelby Township, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 215 days.

(21) Appl. No.: 16/211,727

(22) Filed: Dec. 6, 2018

(65) Prior Publication Data

US 2020/0185667 A1 Jun. 11, 2020

(51) Int. Cl.
| | |
|---|---|
| H01M 2/02 | (2006.01) |
| H01M 2/10 | (2006.01) |
| H05K 5/03 | (2006.01) |
| H05K 9/00 | (2006.01) |
| H01M 50/124 | (2021.01) |
| B60R 16/02 | (2006.01) |
| H05K 5/00 | (2006.01) |
| H01M 50/10 | (2021.01) |
| H01M 50/20 | (2021.01) |
| H01M 50/116 | (2021.01) |
| B60K 6/28 | (2007.10) |
| B60L 50/64 | (2019.01) |

(52) U.S. Cl.
CPC ....... H01M 50/124 (2021.01); B60R 16/0215 (2013.01); H01M 50/10 (2021.01); H01M 50/116 (2021.01); H01M 50/20 (2021.01); H05K 5/0017 (2013.01); H05K 5/03 (2013.01); H05K 9/0084 (2013.01); B60K 6/28 (2013.01); B60L 50/64 (2019.02); H01M 2220/20 (2013.01)

(58) Field of Classification Search
CPC ............. H01M 2/0287; H01M 2/1077; H01M 2/0237; H01M 2/0262; H01M 2/0285; H01M 2/1072; H01M 2/20; H01M 2220/20; H05K 5/03; H05K 9/0084; H05K 5/0017; B60R 16/0215; B60L 50/64; B60K 6/28; B60K 1/04; Y02E 60/10; Y02T 10/70
See application file for complete search history.

(56) References Cited

U.S. PATENT DOCUMENTS

| | | |
|---|---|---|
| 5,208,728 A | 5/1993 | Schirmer |
| 6,090,728 A | 7/2000 | Yenni, Jr. et al. |
| 8,742,255 B2 | 6/2014 | Pavlovic et al. |
| 2003/0184976 A1 | 10/2003 | Brandenburg et al. |
| 2013/0135797 A1* | 5/2013 | Pavlovic ............. H02G 3/08 361/679.01 |
| 2015/0349306 A1* | 12/2015 | Watanabe ............ H01M 2/12 429/56 |
| 2016/0044840 A1 | 2/2016 | Wagner et al. |
| 2016/0301117 A1* | 10/2016 | Tyler ................ C09J 163/00 |
| 2018/0013113 A1* | 1/2018 | Wuensche ......... H01M 2/1083 |
| 2018/0241019 A1* | 8/2018 | Iqbal ................. F16B 43/00 |

FOREIGN PATENT DOCUMENTS

WO 2013/020700 A1 2/2013

* cited by examiner

Primary Examiner — Muhammad S Siddiquee
(74) Attorney, Agent, or Firm — David B. Kelley; Carlson, Gaskey & Olds

(57) ABSTRACT

This disclosure details exemplary electrical module designs for use in electrified vehicles. An exemplary electrical module (e.g., a battery pack, control module, etc.) may include a component (e.g., battery array, bussed electrical center, battery electric control module, etc.) and an enclosure assembly that houses the component. The enclosure assembly may include a polymer-based substrate and a metallic foil that is adapted to improve an electromagnetic compatibility of the polymer-based substrate. A compression limiter may be positioned within the enclosure assembly and is adapted to establish a conductive path between the metallic foil and a separate metallic component (e.g., a fastener) of the electrical module.

20 Claims, 4 Drawing Sheets

ENCLOSURE ASSEMBLIES WITH IMPROVED ELECTROMAGNETIC COMPATIBILITY

TECHNICAL FIELD

This disclosure relates to electrical modules, and more particularly to enclosure assemblies that include features for increasing the electromagnetic compatibility of polymer-based components of electrical modules.

BACKGROUND

The desire to reduce automotive fuel consumption and emissions has been well documented. Therefore, electrified vehicles are being developed that reduce or completely eliminate reliance on internal combustion engines. In general, electrified vehicles differ from conventional motor vehicles because they are selectively driven by one or more battery powered electric machines. Conventional motor vehicles, by contrast, rely exclusively on the internal combustion engine to propel the vehicle.

A high voltage battery pack typically powers the electric machines and other electrical loads of the electrified vehicle. The battery pack includes a plurality of battery cells that may be arranged in one or more battery arrays. An enclosure assembly houses the battery arrays and other battery components of the battery pack.

Metallic-based enclosure assemblies provide a conductive path for directing electromagnetic radiation to ground, thereby substantially reducing electromagnetic interference within the battery pack environment. However, polymer-based components of enclosure assemblies are generally non-conductive and therefore may cause electromagnetic compatibility issues within the battery pack environment.

SUMMARY

A vehicle electrical module according to an exemplary aspect of the present disclosure includes, among other things, a component and an enclosure assembly housing the component. The enclosure assembly includes a polymer-based substrate and a metallic foil adapted to improve an electromagnetic compatibility of the polymer-based substrate. A compression limiter is received within an opening of the enclosure assembly and is adapted to establish a conductive path between the metallic foil and a different metallic component.

In a further non-limiting embodiment of the foregoing vehicle electrical module, the vehicle electrical module is a battery pack or a control module.

In a further non-limiting embodiment of either of the foregoing vehicle electrical modules, the component is a battery array, a bussed electrical center (BEC), or a battery electric control module (BECM).

In a further non-limiting embodiment of any of the foregoing vehicle electrical modules, the polymer-based substrate and the metallic foil together establish a wall of the enclosure assembly.

In a further non-limiting embodiment of any of the foregoing vehicle electrical modules, the wall is part of a cover of the enclosure assembly.

In a further non-limiting embodiment of any of the foregoing vehicle electrical modules, the wall is part of a tray of the enclosure assembly.

In a further non-limiting embodiment of any of the foregoing vehicle electrical modules, the metallic foil is sandwiched between an outer layer and an inner layer of the polymer-based substrate.

In a further non-limiting embodiment of any of the foregoing vehicle electrical modules, the outer layer is constructed of polyamide, the inner layer is constructed of polypropylene, and the metallic foil is constructed of aluminum.

In a further non-limiting embodiment of any of the foregoing vehicle electrical modules, the polymer-based substrate is secured to an exterior surface of the metallic foil.

In a further non-limiting embodiment of any of the foregoing vehicle electrical modules, the polymer-based substrate is secured to an interior surface of the metallic foil.

In a further non-limiting embodiment of any of the foregoing vehicle electrical modules, a lower plateau of the compression limiter is received against a first portion of the metallic foil that is between an outer layer and an inner layer of the polymer-based substrate, and a circumferential wall of the compression limiter protrudes upwardly from the lower plateau and is received against a second portion of the metallic foil that lines the opening.

In a further non-limiting embodiment of any of the foregoing vehicle electrical modules, the compression limiter is flush relative to an inner layer of the polymer-based substrate and is countersunk relative to an outer layer of the polymer-based substrate.

In a further non-limiting embodiment of any of the foregoing vehicle electrical modules, the different metallic component is a fastener.

In a further non-limiting embodiment of any of the foregoing vehicle electrical modules, the metallic foil, the compression limiter, and the different metallic component are each constructed of the same metallic material.

In a further non-limiting embodiment of any of the foregoing vehicle electrical modules, the enclosure assembly includes a tray, a first cover, and a second cover.

A method according to another exemplary aspect of the present disclosure includes, among other things, securing together a polymer-based substrate and a metallic foil to establish a wall of an enclosure assembly, and positioning a metallic compression limiter within an opening of the wall. The metallic compression limiter establishes a conductive path between the metallic foil and a separate metallic component.

In a further non-limiting embodiment of the foregoing method, the securing together includes overmolding a first layer of the polymer-based substrate onto a first side of the metallic foil, and overmolding a second layer of the polymer-based substrate onto a second side of the metallic foil.

In a further non-limiting embodiment of either of the foregoing methods, the securing together includes overmolding the polymer-based substrate onto either an exterior surface or an interior surface of the metallic foil.

In a further non-limiting embodiment of any of the foregoing methods, the separate metallic component is a fastener received through the compression limiter.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

The various features and advantages of this disclosure will become apparent to those skilled in the art from the following detailed description. The drawings that accompany the detailed description can be briefly described as follows.

DETAILED DESCRIPTION

This disclosure details exemplary electrical module designs for use in electrified vehicles. An exemplary electrical module (e.g., a battery pack, control module, etc.) may include a component (e.g., battery array, bussed electrical center, battery electric control module, etc.) and an enclosure assembly that houses the component. The enclosure assembly may include a polymer-based substrate and a metallic foil that is adapted to improve an electromagnetic compatibility of the polymer-based substrate. A compression limiter may be positioned within the enclosure assembly and is adapted to establish a conductive path between the metallic foil and a separate metallic component (e.g., a fastener) of the electrical module. These and other features are discussed in greater detail in the following paragraphs of this detailed description.

Figure 1:
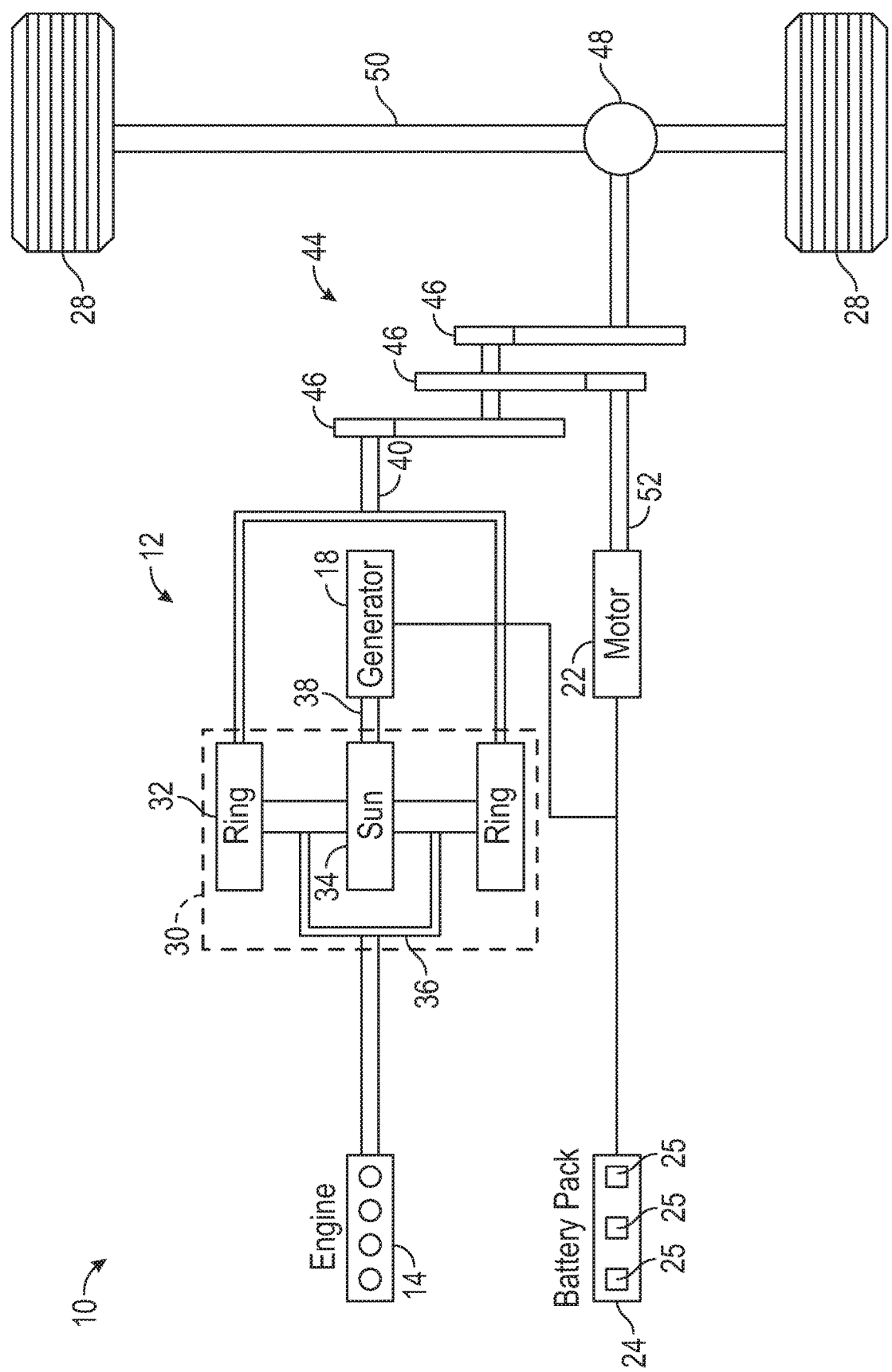
FIG. 1 schematically illustrates an electrified vehicle powertrain.

FIG. 1 schematically illustrates a powertrain 10 of an electrified vehicle 12. In an embodiment, the powertrain 10 is a hybrid electric vehicle (HEV) powertrain. However, although depicted in an embodiment as a HEV, the concepts described herein could extend to other electrified vehicles, including, but not limited to, plug-in hybrid electric vehicles (PHEVs), battery electric vehicles (BEVs), fuel cell vehicles, etc.

In an embodiment, the powertrain 10 is a power-split powertrain system that employs first and second drive systems. The first drive system includes a combination of an engine 14 and a generator 18 (i.e., a first electric machine). The second drive system includes at least a motor 22 (i.e., a second electric machine), the generator 18, and a battery pack 24. In this example, the second drive system is considered an electric drive system of the powertrain 10. The first and second drive systems are each capable of generating torque to drive one or more sets of vehicle drive wheels 28 of the electrified vehicle 12. Although a power-split configuration is depicted in FIG. 1, this disclosure extends to any hybrid or electric vehicle including full hybrids, parallel hybrids, series hybrids, mild hybrids, or micro hybrids.

The engine 14, which may be an internal combustion engine, and the generator 18 may be connected through a power transfer unit 30, such as a planetary gear set. Of course, other types of power transfer units, including other gear sets and transmissions, may be used to connect the engine 14 to the generator 18. In an embodiment, the power transfer unit 30 is a planetary gear set that includes a ring gear 32, a sun gear 34, and a carrier assembly 36.

The generator 18 can be driven by the engine 14 through the power transfer unit 30 to convert kinetic energy to electrical energy. The generator 18 can alternatively function as a motor to convert electrical energy into kinetic energy, thereby outputting torque to a shaft 38 connected to the power transfer unit 30. Because the generator 18 is operatively connected to the engine 14, the speed of the engine 14 can be controlled by the generator 18.

The ring gear 32 of the power transfer unit 30 may be connected to a shaft 40, which is connected to vehicle drive wheels 28 through a second power transfer unit 44. The second power transfer unit 44 may include a gear set having a plurality of gears 46. Other power transfer units may also be suitable. The gears 46 transfer torque from the engine 14 to a differential 48 to ultimately provide traction to the vehicle drive wheels 28. The differential 48 may include a plurality of gears that enable the transfer of torque to the vehicle drive wheels 28. In an embodiment, the second power transfer unit 44 is mechanically coupled to an axle 50 through the differential 48 to distribute torque to the vehicle drive wheels 28.

The motor 22 can also be employed to drive the vehicle drive wheels 28 by outputting torque to a shaft 52 that is also connected to the second power transfer unit 44. In an embodiment, the motor 22 and the generator 18 cooperate as part of a regenerative braking system in which both the motor 22 and the generator 18 can be employed as motors to output torque. For example, the motor 22 and the generator 18 can each output electrical power to the battery pack 24.

The battery pack 24 is an exemplary electrified vehicle battery. The battery pack 24 may be a high voltage traction battery pack that includes one or more battery arrays 25 (i.e., battery assemblies or groupings of battery cells) that are capable of outputting electrical power to operate the motor 22, the generator 18, and/or other electrical loads of the electrified vehicle 12 for providing power to propel the drive wheels 28. Other types of energy storage devices and/or output devices could also be used to electrically power the electrified vehicle 12.

In an embodiment, the electrified vehicle 12 has two basic operating modes. The electrified vehicle 12 may operate in an Electric Vehicle (EV) mode where the motor 22 is used (generally without assistance from the engine 14) for vehicle propulsion, thereby depleting the battery pack 24 state of charge up to its maximum allowable discharging rate under certain driving patterns/cycles. The EV mode is an example of a charge depleting mode of operation for the electrified vehicle 12. During EV mode, the state of charge of the battery pack 24 may increase in some circumstances, for example due to a period of regenerative braking. The engine 14 is generally OFF under a default EV mode but could be operated as necessary based on a vehicle system state or as permitted by the operator.

The electrified vehicle 12 may additionally operate in a Hybrid (HEV) mode in which the engine 14 and the motor 22 are both used for vehicle propulsion. The HEV mode is an example of a charge sustaining mode of operation for the electrified vehicle 12. During the HEV mode, the electrified vehicle 12 may reduce the motor 22 propulsion usage in order to maintain the state of charge of the battery pack 24 at a constant or approximately constant level by increasing the engine 14 propulsion. The electrified vehicle 12 may be operated in other operating modes in addition to the EV and HEV modes within the scope of this disclosure.

Figure 2:
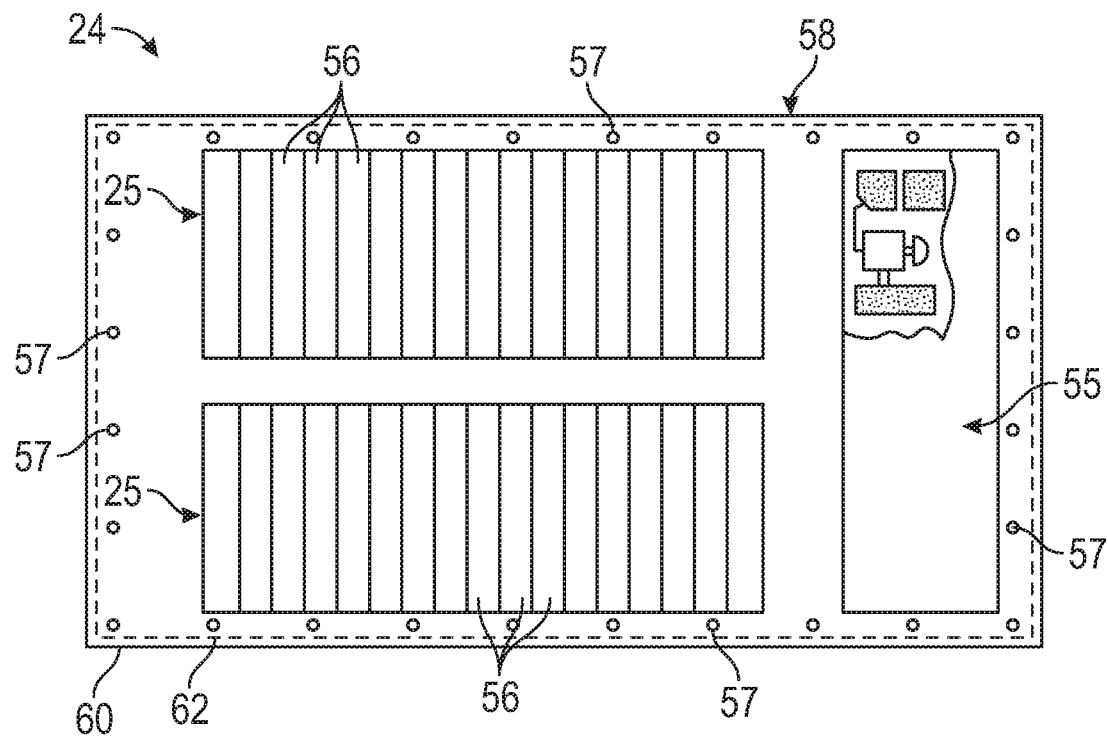
FIG. 2 illustrates an exemplary battery pack of an electrified vehicle.

FIG. 2 schematically illustrates a battery pack 24 that can be employed within an electrified vehicle, such as the electrified vehicle 12 of FIG. 1. The battery pack 24 is one example of a vehicle electrical module that could benefit from the teachings of this disclosure. However, this disclosure is not limited to battery packs, and the teachings of this disclosure could extend to various other electrical modules, such as control modules, that include polymer-based enclosure walls.

The battery pack 24 may house a plurality of battery cells 56 that store energy for powering various electrical loads of the electrified vehicle 12. The battery pack 24 could employ any number of battery cells 56 within the scope of this disclosure. Accordingly, this disclosure is not limited to the exact configuration shown in FIG. 2.

The battery cells 56 may be stacked side-by-side along one or more stack longitudinal axes to construct groupings of battery cells 56, sometimes referred to as a "cell stacks" or "cell arrays." In an embodiment, the battery cells 56 are prismatic, lithium-ion cells. However, battery cells having other geometries (cylindrical, pouch, etc.), other chemistries (nickel-metal hydride, lead-acid, etc.), or both could alternatively be utilized within the scope of this disclosure.

The battery cells 56 of each grouping, along with any support structures (e.g., array frames, spacers, rails, walls, plates, bindings, etc.), may collectively be referred to as a battery assembly or a battery array 25. The battery pack 24 depicted in FIG. 2 includes two battery arrays 25; however, the battery pack 24 could include a greater or fewer number of battery arrays and still fall within the scope of this disclosure. Again, this disclosure is not limited to the specific configuration shown in FIG. 2.

The battery pack 24 may additionally house one or more battery electronic components 55. The battery electronic components 55 could include a bussed electrical center (BEC), a battery electric control module (BECM), wiring harnesses, wiring loops, I/O connectors, etc., or any combination of these battery electronic components. The specific arrangement of the battery arrays 25 and the battery electronic components 55 shown in FIG. 2 is but one non-limiting example of how the various components of the battery pack 24 could be arranged and is thus not intended to limit this disclosure.

In this disclosure, the battery arrays 25 and the battery electronic components 55 may be collectively referred to as "battery components" of the battery pack 24. Moreover, any component housed inside the battery pack 24 may be referred to as a battery component.

An enclosure assembly 58 may house each battery array 25 and each battery electronic component 55 of the battery pack 24. The enclosure assembly 58 may be a sealed housing that includes a tray 60 and a cover 62 (shown in phantom to better illustrate the internal contents of the battery pack 24). The enclosure assembly 58 may include any size, shape, and configuration within the scope of this disclosure.

In the embodiment of FIG. 2, the cover 62 may be a single cover that extends over top of both the battery arrays 25 and the battery electronic components 55. However, in another embodiment, the enclosure assembly 58 could employ a dual-cover arrangement that includes a first cover 62A that covers the battery arrays 25 and a second cover 62B that covers the battery electronic components 55 (see FIG. 3).

Portions of the enclosure assembly 58 may be assembled together or secured relative to another component of the battery pack 24 using a plurality of fasteners 57. The fasteners 57 may be threaded fasteners, bolts, or any other suitable mechanical fastener or combinations of mechanical fasteners. In an embodiment, the cover 62 (or the covers 62A, 62B) may be secured to either the tray 60 or another battery component by the plurality of fasteners 57.

Figure 3:
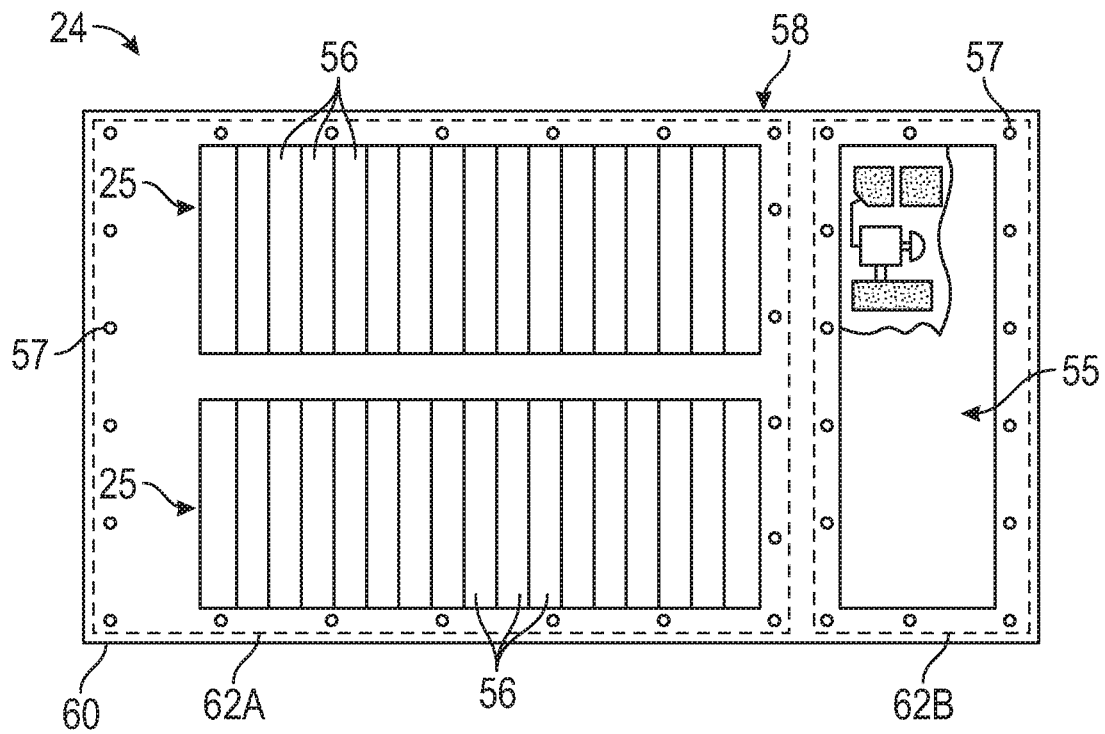
FIG. 3 illustrates another exemplary battery pack of an electrified vehicle.
Figure 4:
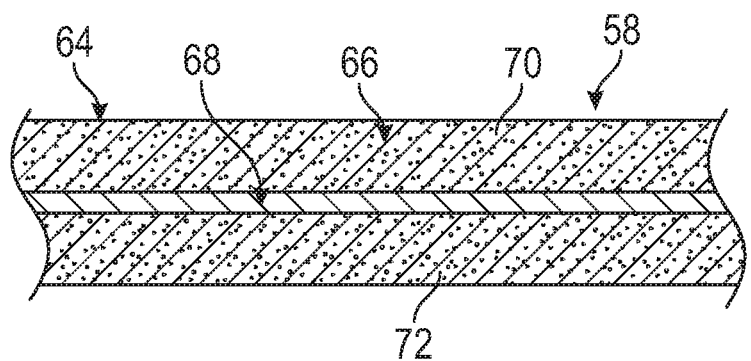
FIG. 4 illustrates portions of a wall of a battery pack enclosure assembly.

FIG. 4, with continued reference to FIGS. 2-3, illustrates select portions of a wall 64 of the enclosure assembly 58. The wall 64 may be part of the tray 60 or may be part of any of the covers 62, 62A, 62B of the enclosure assembly 58. The wall 64 may include a polymer-based substrate 66 and a metallic foil 68, which may be a relatively thin sheet of metallic material.

The metallic foil 68 may be embedded within or otherwise secured to the polymer-based substrate 66 to establish a conductive path within the wall 64. The metallic foil 68 is electrically and magnetically conductive and is therefore adapted to provide the enclosure assembly 58 with electromagnetic radiation shielding properties. For example, the metallic foil 68 may be configured to shield the battery components located inside the battery pack 24 from electromagnetic interferences that originate from electronics located near the battery pack 24 and vice versa, thereby improving the electromagnetic compatibility of the enclosure assembly 58.

Figure 5:
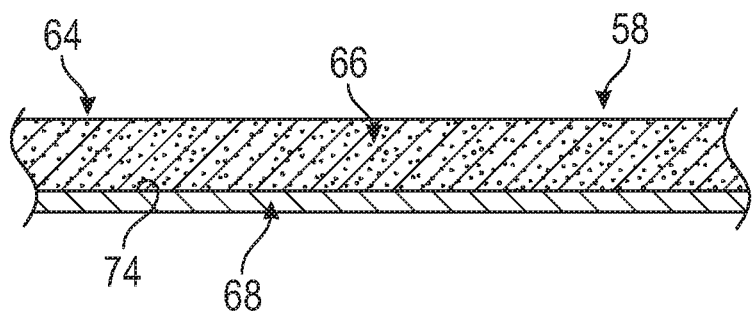
FIG. 5 illustrates portions of another wall of a battery pack enclosure assembly.
Figure 6:
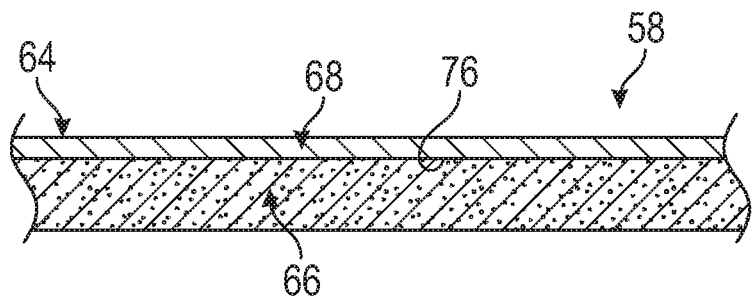
FIG. 6 illustrates portions of yet another wall of a battery pack enclosure assembly.

In an embodiment, the metallic foil 68 is sandwiched between an outer layer 70 and an inner layer 72 of the polymer-based substrate 66 in order to embed the metallic foil 68 inside of the polymer-based substrate 66. In another embodiment, the polymer-based substrate 66 is secured to an exterior surface 74 of the metallic foil 68 to construct the wall 64 (see FIG. 5). In yet another embodiment, the polymer-based substrate 66 is secured to an interior surface 76 of the metallic foil 68 to construct the wall 64 (see FIG. 5). The configurations of the walls 64 shown in FIGS. 4, 5, and 6 can be utilized in select, discrete sections of the enclosure assembly 58 or could be employed in each wall of the enclosure assembly 58. In addition, the configurations of FIGS. 4, 5, and 6 are not shown to scale and have been exaggerated to better illustrate the various features of this disclosure.

The polymer-based substrate 66 and the metallic foil 68 may be secured to one another using an overmolding method. A first exemplary overmolding method may include overmolding the outer layer 70 onto a first side of the metallic foil 68 and then overmolding the inner layer 72 onto a second side of the metallic foil 68 to construct the wall 64 of FIG. 4. The outer layer 70 and the inner layer 72 may be constructed of the same or different polymer-based materials. A second exemplary overmolding method may include overmolding the polymer-based substrate 66 onto the exterior surface 74 of the metallic foil 68 to construct the wall 64 of FIG. 5. A third exemplary overmolding method may include overmolding the polymer-based substrate 66 onto the interior surface 76 of the metallic foil 68 to construct the wall 64 of FIG. 6. Other manufacturing techniques could also be used to secure the polymer-based substrate 66 and the metallic foil 68 together. For example, in other embodiments, the polymer-based substrate 66 and the metallic foil 68 could be either glued together or mechanically fixated to one another.

The polymer-based substrate 66 of the wall 64 may be made of any suitable polymer-based material. Exemplary polymer-based materials include, but are not limited to, polyethylene, polypropylene, polystyrene, polyethylene, sheet moulding compounds (e.g., glass-fiber reinforced polyester), polyamine, and polyamide (e.g., nylon), and combinations thereof.

The outer layer 70 and the inner layer 72 of the wall 64 of FIG. 4 could be constructed (e.g., molded) of different polymer-based materials. In an embodiment, the outer layer 70 is constructed of polyamide and the inner layer 72 is constructed of polypropylene. Other material combinations could alternatively be used within the scope of this disclosure.

The metallic foil 68 of the wall 64 may be made of any suitable metallic materials. Exemplary metallic materials include, but are not limited to, aluminum, steel, and copper.

Figure 7:
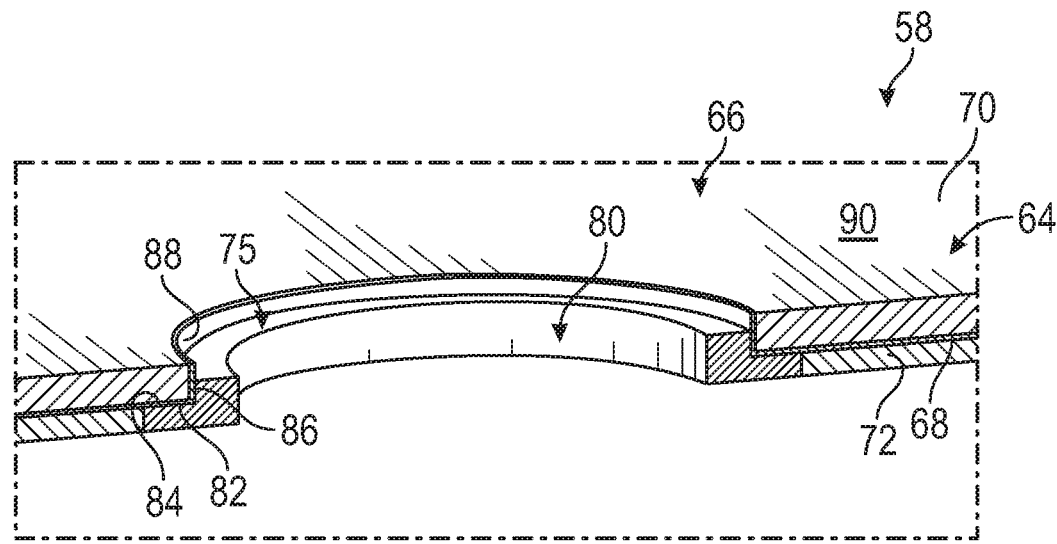
FIG. 7 illustrates a compression limiter associated with a battery pack enclosure assembly.
Figure 8:
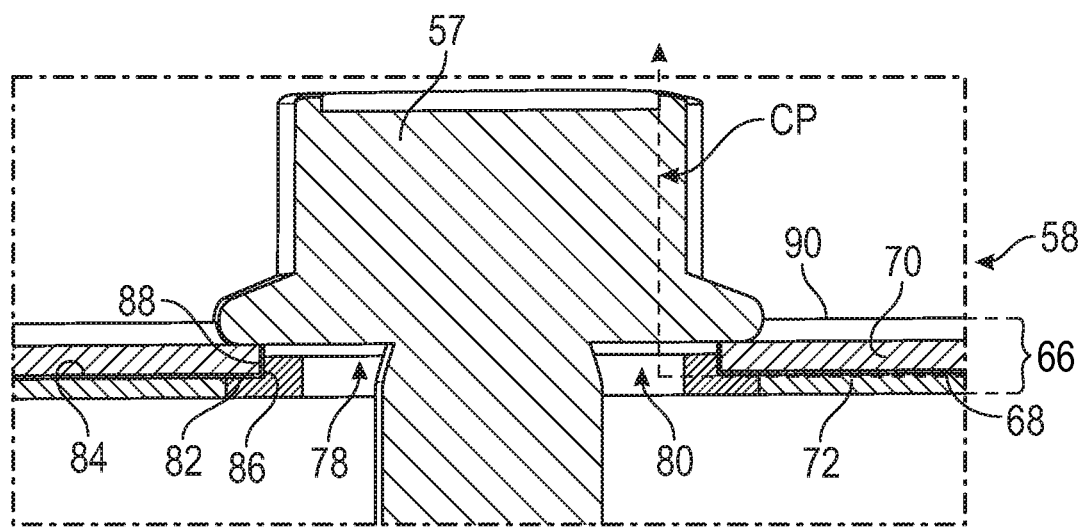
FIG. 8 schematically illustrates a conductive path established by the compression limiter of FIG. 7.

Referring now to FIGS. 7-8, the wall 64 of the enclosure assembly 58 may include one or more openings 78. Each opening 78 is configured for receiving one of the fasteners 57 (see FIG. 8). The fasteners 57 may be metallic fasteners that are utilized to mount the wall 64 to either another section of the enclosure assembly 58 or to another component of the battery pack 24.

A compression limiter 80 may be positioned within each opening 78 of the wall 64. The compression limiter 80 may increase the overall robustness at each of the fastener 57 connections. For example, the compression limiter 80 may improve the transfer of forces generated by the fastener 57, thereby substantially preventing damage to the metallic foil 68.

The compression limiter 80 may additionally establish a conductive path CP between the metallic foil 68 and the fastener 57. The compression limiter 80 therefore acts as a grounding point for electrically grounding the metallic foil 68.

In an embodiment, the compression limiter 80 includes a stepped-flange design. A lower plateau 82 of the compression limiter 80 may be received against a first portion 84 of the metallic foil 68 that is between the outer layer 70 and the inner layer 72 of the polymer-based substrate 66, and a circumferential wall 86 that protrudes upwardly from the lower plateau 82 of the compression limiter 80 may be received against a second portion 88 of the metallic foil 68 that lines the portion of the opening 78 that extends through the outer layer 70 of the polymer-based substrate 66. In another embodiment, the compression limiter 80 sits flush relative to the inner layer 72 but is countersunk relative to an exterior surface 90 of the outer layer 70.

The compression limiter 80 may be made of a metallic material. Exemplary metallic materials include, but are not limited to, aluminum, steel, and copper. In an embodiment, the compression limiter 80 is made from the same metallic material as the metallic foil 68 and the fastener 57.

The enclosure assemblies of this disclosure incorporate both polymer-based substrates and metallic foils. The metallic foils provide electromagnetic radiation shielding properties. The enclosure assemblies additionally incorporate compression limiters that both protect the metallic foils from fastener forces and provide a conductive path to ground. The exemplary enclosure assemblies thereby exhibit improved electromagnetic compatibility.

Although the different non-limiting embodiments are illustrated as having specific components or steps, the embodiments of this disclosure are not limited to those particular combinations. It is possible to use some of the components or features from any of the non-limiting embodiments in combination with features or components from any of the other non-limiting embodiments.

It should be understood that like reference numerals identify corresponding or similar elements throughout the several drawings. It should be understood that although a particular component arrangement is disclosed and illustrated in these exemplary embodiments, other arrangements could also benefit from the teachings of this disclosure.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A vehicle electrical module, comprising:
a component;
an enclosure assembly housing the component,
wherein the enclosure assembly includes a polymer-based substrate and a metallic foil adapted to improve an electromagnetic compatibility of the polymer-based substrate; and
a compression limiter received within an opening of the enclosure assembly and adapted to establish a conductive path between the metallic foil and a different metallic component,
wherein a first portion of the metallic foil is located inwardly from an outer layer of the polymer-based substrate and a second portion of the metallic foil lines a surface of the outer layer that circumscribes the opening.

2. The vehicle electrical module as recited in claim 1, wherein the vehicle electrical module is a battery pack or a control module.

3. The vehicle electrical module as recited in claim 1, wherein the component is a battery array, a bussed electrical center (BEC), or a battery electric control module (BECM).

4. The vehicle electrical module as recited in claim 1, wherein, together, the polymer-based substrate and the metallic foil establish a wall of the enclosure assembly.

5. The vehicle electrical module as recited in claim 4, wherein the wall is part of a cover of the enclosure assembly.

6. The vehicle electrical module as recited in claim 4, wherein the wall is part of a tray of the enclosure assembly.

7. The vehicle electrical module as recited in claim 1, wherein the metallic foil is sandwiched between an outer layer and an inner layer of the polymer-based substrate.

8. The vehicle electrical module as recited in claim 7 wherein the outer layer is constructed of polyamide, the inner layer is constructed of polypropylene, and the metallic foil is constructed of aluminum.

9. The vehicle electrical module as recited in claim 1, wherein the polymer-based substrate is secured to an exterior surface of the metallic foil.

10. The vehicle electrical module as recited in claim 1, wherein the polymer-based substrate is secured to an interior surface of the metallic foil.

11. The vehicle electrical module as recited in claim 1, wherein a lower plateau of the compression limiter is received against the first portion of the metallic foil that is between the outer layer and an inner layer of the polymer-based substrate, and a circumferential wall of the compression limiter protrudes upwardly from the lower plateau and is received against the second portion of the metallic foil that lines the surface of the outer layer that circumscribes the opening.

12. The vehicle electrical module as recited in claim 1, wherein the compression limiter is flush relative to an inner layer of the polymer-based substrate and is countersunk relative to the outer layer of the polymer-based substrate.

13. The vehicle electrical module as recited in claim 1, wherein the different metallic component is a fastener.

14. The vehicle electrical module as recited in claim 1, wherein the metallic foil, the compression limiter, and the different metallic component are each constructed of the same metallic material.

15. The vehicle electrical module as recited in claim 1, wherein the enclosure assembly includes a tray, a first cover, and a second cover.

16. The vehicle electrical module as recited in claim 13, wherein the second portion of the metallic foil directly contacts a head of the fastener when the fastener is received within the opening.

17. The vehicle electrical module as recited in claim 13, wherein a head of the fastener contacts the outer layer but not the compression limiter.

18. The vehicle electrical module as recited in claim 11, wherein a surface of the inner layer that circumscribes the opening is offset from the surface of the outer layer that circumscribes the opening to accommodate a stepped flange design of the compression limiter.

19. The vehicle electrical module as recited in claim 18, wherein the surface of the inner layer circumscribes a lower portion of the opening and the surface of the outer layer circumscribes an upper portion of the opening, and further wherein the lower portion expands radially outwardly of the upper portion.

20. A vehicle electrical module, comprising:
a battery array;
an enclosure assembly housing the battery array,
wherein the enclosure assembly includes a polymer-based substrate and a metallic foil that is secured to the polymer-based substrate and adapted to improve an electromagnetic compatibility of the polymer-based substrate; and
a compression limiter received within an opening of the enclosure assembly and adapted to establish a conductive path between the metallic foil and a fastener received through the opening,
wherein a first portion of the metallic foil is located between an outer layer and an inner layer of the polymer-based substrate and a second portion of the metallic foil lines a surface of the outer layer that circumscribes the opening,
wherein the compression limiter is countersunk relative to an outermost surface of the outer layer of the polymer-based substrate.

\* \* \* \* \*